United States Patent
Fink et al.

(10) Patent No.: US 7,653,137 B2
(45) Date of Patent: Jan. 26, 2010

(54) METHOD FOR TEMPORAL INVERSION OF A WAVE

(75) Inventors: Mathias Fink, Meudon (FR); Geoffroy Lerosey, Paris (FR); Arnaud Derode, Paris (FR); Julien De Rosny, Nogent sur Marne (FR); Arnaud Tourin, Sevres (FR)

(73) Assignees: Centre National de la Recherche -CNRS-, Paris Cedex (FR); Universite Paris 7 - Denis Diderot, Paris Cedex (FR)

( * ) Notice: Subject to any disclaimer, the term of this patent is extended or adjusted under 35 U.S.C. 154(b) by 453 days.

(21) Appl. No.: 10/599,846

(22) PCT Filed: Apr. 11, 2005

(86) PCT No.: PCT/FR2005/000872

§ 371 (c)(1),
(2), (4) Date: Oct. 11, 2006

(87) PCT Pub. No.: WO2005/104473

PCT Pub. Date: Nov. 3, 2005

(65) Prior Publication Data

US 2007/0211788 A1 Sep. 13, 2007

(30) Foreign Application Priority Data

Apr. 13, 2004 (FR) .................................. 0403845

(51) Int. Cl.
*H04L 27/00* (2006.01)
(52) U.S. Cl. .......................... 375/259; 375/295; 455/20
(58) Field of Classification Search ......... 375/295–296, 375/259–260; 455/7, 20, 22, 63.1, 114.3, 455/131, 323

See application file for complete search history.

(56) References Cited

U.S. PATENT DOCUMENTS

| | | | | |
|---|---|---|---|---|
| 4,058,677 A | * | 11/1977 | Maitland et al. | 380/40 |
| 4,320,531 A | * | 3/1982 | Dimon | 455/203 |
| 4,611,231 A | * | 9/1986 | Kobayashi | 348/613 |
| 5,825,887 A | * | 10/1998 | Lennen | 380/34 |
| 5,872,806 A | * | 2/1999 | Enderlein et al. | 375/130 |
| 5,970,047 A | * | 10/1999 | Suzuki | 370/210 |
| 6,404,775 B1 | * | 6/2002 | Leslie et al. | 370/466 |
| 6,927,889 B2 | * | 8/2005 | Schwarte | 359/237 |
| 2002/0141478 A1 | * | 10/2002 | Ozluturk et al. | 375/130 |
| 2003/0138053 A1 | | 7/2003 | Candy et al. | |
| 2004/0014498 A1 | | 1/2004 | Grego | |

(Continued)

OTHER PUBLICATIONS

Gomes J. et al, "Asymmetric Underwater Acoustic Communication Using a Time-Reversal Mirror", IEE, vol. 3, pp. 1847-1851, (Sep. 11, 2000).

(Continued)

*Primary Examiner*—Jean B Corrielus
(74) *Attorney, Agent, or Firm*—Miller, Matthias & Hull

(57) ABSTRACT

According to the invention, a wave, corresponding to a signal s(t) may be temporally inverted by application of a first transformation to lower the central frequency thereof to produce a first set of transformed signals Ki(t) then a second set of transformed signals K'i(t) is produced representing the temporal inversion signal s(−t) and a third transformation is applied to said second set to generate the temporally-inverted signal s(−t)

14 Claims, 2 Drawing Sheets

U.S. PATENT DOCUMENTS

| | | | | |
|---|---|---|---|---|
| 2004/0044506 A1* | 3/2004 | Meinila et al. | ......... | 703/5 |
| 2004/0198298 A1* | 10/2004 | Waight et al. | ......... | 455/333 |
| 2005/0009494 A1* | 1/2005 | Sorrells et al. | ......... | 455/313 |
| 2005/0094743 A1* | 5/2005 | Rakib et al. | ......... | 375/302 |
| 2005/0159128 A1* | 7/2005 | Collins et al. | ......... | 455/284 |

OTHER PUBLICATIONS

French Preliminary Search Report FR0403845; report dated Dec. 8, 2004.

International Search Report PCT/FR2005/000872, report dated Aug. 24, 2005.

\* cited by examiner

METHOD FOR TEMPORAL INVERSION OF A WAVE

CROSS REFERENCE TO RELATED APPLICATION

This is the U.S. National Phase of International Application No. PCT/FR05/00872, filed on Apr. 11, 2005, the entire disclosure of which is incorporated by reference

FIELD OF THE DISCLOSURE

The present invention pertains to methods for the temporal inversion of waves.

BACKGROUND OF THE DISCLOSURE

More particularly, the invention relates to a method for temporal inversion of a wave corresponding to at least one initial signal $s(t)$, where t is the time, this initial signal $s(t)$ exhibiting a certain central frequency $f0$ and a passband $\Delta f$, in which method a temporal inversion signal $\alpha \cdot s(-t)$, where $\alpha$ is a constant or time-varying multiplicative coefficient and $s(-t)$ is the temporal inversion of $s(t)$, is determined.

Document EP-A-0 803 991 describes an example of such a method, which has the drawback of calling upon approximations of the temporal inversion of certain signals, this working only under certain special conditions, in particular when the passband is very narrow.

The present invention is aimed in particular at alleviating this drawback.

SUMMARY OF THE DISCLOSURE

For this purpose, according to the invention, a method of the kind in question is characterized in that it comprises the following steps:
- a first transformation suitable for lowering the central frequency of the signal and for substantially not causing any loss of information with respect to the initial signal is applied to the initial signal $s(t)$, said first transformation producing a first set of transformed signals comprising at least one first transformed signal $Ki(t)$ of lower central frequency than the initial signal, said first set of transformed signals $Ki(t)$ being representative of said initial signal $s(t)$,
- a second transformation producing a second transformed signal $K'i(t)$ substantially of the same central frequency as the first transformed signal is applied to each first transformed signal $Ki(t)$, said second transformation thus producing a second set of transformed signals $K'i(t)$ from the first set of transformed signals $Ki(t)$, said second transformation being chosen so that said second set of transformed signals is representative of the temporal inversion signal $s(-t)$,
- a third transformation which generates the temporal inversion signal $\alpha \cdot s(-t)$ is applied to the second set of transformed signals $K'i(t)$, By virtue of these provisions, one succeeds in producing a temporally inverted wave without having to work at the frequency $f0$, which, in digital mode, would require the signal to be sampled at a sampling frequency at least equal to twice the maximum frequency of the signal $s(t)$ and would therefore involve the use of relatively expensive hardware, in particular if the frequency $f0$ is high. On the contrary, according to the invention, one exploits the fact that the passband $\Delta f$ of the signal $s(t)$ is below $f0$ so as to reduce said signal to a lower frequency without loss of information, this generally being possible by a simple and standard operation, for example of demodulation type. The signal or signals $Ki(t)$ of lower frequency may then be sampled and processed to obtain the signal or signals $K'i(t)$ representative of $s(-t)$, with electronics that operate at relatively low frequency and are therefore fairly cheap By a standard operation for example of modulation type (for example the operation inverse to that applied initially to the signal $s(t)$), one subsequently returns to higher frequency, recreating the signal $s(-t)$.

In preferred embodiments of the invention, it may be possible, moreover, to resort to one and/or other of the following arrangements:
- the passband $\Delta f$ is less than $f0$;
- the third transformation is a transformation inverse to the first transformation;
- the first transformation is a demodulation suitable for eliminating a carrier signal of frequency $f0$ so as to extract said first set of transformed signals $Ki(t)$ from the initial signal $s(t)$, and the third transformation is a modulation of a carrier signal of frequency $f0$ by the signal or signals $K'i(t)$;
- the first transformation is an IQ demodulation producing two first transformed signals $K1(t)=I(t)$ and $K2(t)=Q(t)$ such that $s(t)=I(t)\cos(2\pi \cdot f0 \cdot t)+Q(t)\sin(2\pi \cdot f0 \cdot t)$, the second transformation transforms the signal $K1(t)$ into $K'1(t)=I(-t)$ and the signal $K2(t)$ into $K'2(t)=-Q(-t)$, and the third transformation is an IQ modulation inverse to said demodulation;
- the first transformation is an amplitude and phase demodulation producing two first transformed signals $K1(t)=A(t)$, and $K2(t)=\phi(t)$, where $A(t)$ is the amplitude of the signal $s(t)$ and $\phi(t)$ the phase of the signal $s(t)$, the second transformation transforms the signal $K1(t)$ to $K'1(t)=A(-t)$ and the signal $K2(t)$ to $K'2(t)=-\phi(-t)$, and the third transformation is a modulation inverse to said demodulation, producing the temporal inversion signal $s(-t)=A(-t)\cos[2\pi \cdot f0 \cdot t - \phi(-t)]$;
- the first transformation is a subsampling, with a sampling frequency of less than $2f0$ but at least equal to $2\Delta f$, producing a single transformed signal $K1(t)$, the second transformation is a temporal inversion transforming the signal $K1(t)$ to $K'1(t)=K1(-t)$, and the third transformation is a filtering of passband substantially equal to $\Delta t$ and centered on $f0$, transforming $K'1(t)$ into $s(-t)$;
- the first transformation is a downward frequency shift, into intermediate band, producing a single first transformed signal $K1(t)$, the second transformation is a temporal inversion transforming the signal $K1(t)$ into $K'1(t)=K1(-t)$, and the third transformation is an upward frequency shift, the inverse of said downward frequency shift;
- the first and third transformations are carried out on analog signals, each first transformed signal undergoes a sampling and the second transformation is carried out digitally before converting each second transformed signal into an analog signal;
- the sampling is carried out at a sampling frequency of below the central frequency $f0$;
- the wave is electromagnetic (for example a radio wave or an optical wave);
- the central frequency $f0$ is between 0.7 and 50 GHz;
- the central frequency $f0$ is between 0.7 and 10 GHz.
- the wave is chosen from among acoustic waves and elastic waves.

Other characteristics and advantages of the invention will become apparent in the course of the following description of one of its embodiments, given by way of nonlimiting example, with regard to the appended drawings.

DETAILED DESCRIPTION OF THE DISCLOSURE

Figure 1:
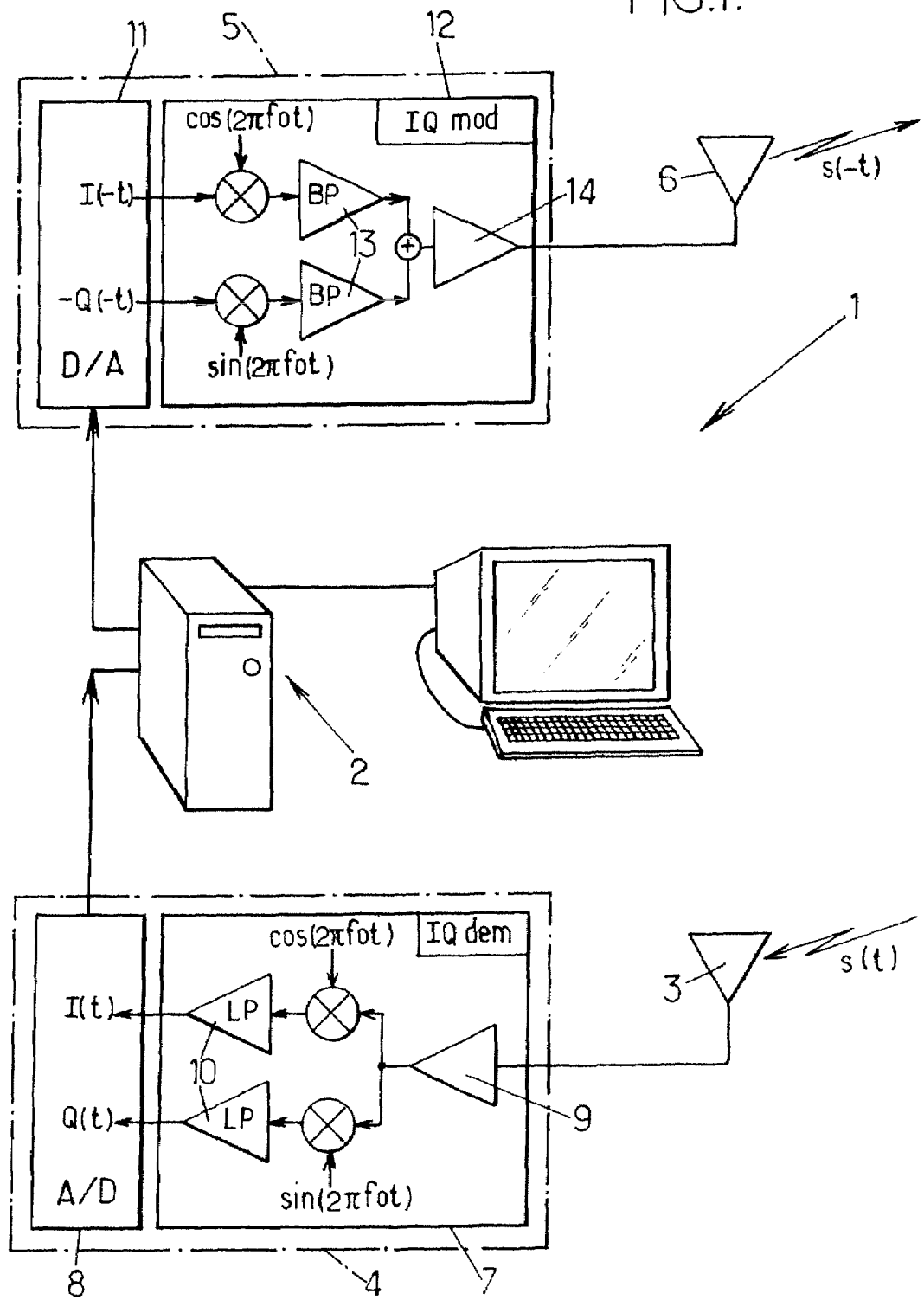
FIG. 1 is a basic diagram representing an exemplary device for transmitting/receiving waves making it possible to implement a method according to an embodiment of the invention.

FIG. 1 represents an exemplary device for transmitting and receiving waves, in this instance electromagnetic radio waves, making it possible to pick up a wave and to invert it temporally, For this purpose, the wave transmission and reception device 1 represented in FIG. 1 comprises for example;
- an electronic central unit 2, for example a microcomputer or a microprocessor(s)-based electronic circuit,
- a radio wave reception antenna 3, suitable for picking up an initial signal s(t) corresponding to an electromagnetic wave, where t represents the time,
- a demodulator set 4 receiving the initial signal s(t) picked up by the reception antenna 3 and linked to the electronic central unit 2 so as to send demodulated signals to it,
- a modulator set 5 linked to the electronic central unit 2 so as to receive from this central unit demodulated signals representative of the temporal inversion s(−t) of the initial signal s(t),
- and a transmitter antenna 6 linked to the modulator set 5 so as to transmit an electromagnetic wave corresponding to the modulated signal α·s(−t), where s(−t) is the temporal inversion of the initial signal s(t) and a is a multiplicative coefficient, constant or time varying.

All these elements may, as appropriate, be included in one and the same electronic apparatus such as a radio telephone, a fixed radio telephone base, or the like.

The initial signal s(t) exhibits a certain central frequency f0 and a passband Δf of less than f0, for example less than f0/2 (generally Δf is small relative to f0).

The initial signal s(t) may be written in real notation: $s(t) = A(t)\cos[2\pi \cdot f0 \cdot t + \phi(t)]$, where A(t) is the amplitude of the signal s(t) and φ(t) its phase.

The signal s(t) is therefore, in general, a signal modulated in amplitude and phase on the basis of a carrier wave of frequency f0, this frequency f0 generally being known in advance.

In the example represented in FIG. 1, the demodulator set 4 comprises an IQ demodulator, 7 which applies a first transformation to the signal s(t) to generate two first transformed signals K1(t)=I(t) and K2(t)=Q(t) corresponding respectively to the in-phase and quadrature modulation of the signal. In real notation, these signals I(t), Q(t) are such that:

$$s(t) = I(t)\cos(2\pi \cdot f0 \cdot t) + Q(t)\sin(2\pi \cdot f0 \cdot t)$$

These signals I(t), Q(t) are provided by the IQ demodulator 7 to an analog digital converter 8 which samples said signals and sends them in digital form to the central unit 2.

To generate the signals I(t), Q(t), the IQ demodulator 7 may for example comprise an amplifier 9 which receives the signal s(t) from the antenna 3 and which feeds two parallel circuits:
- a first circuit in which the signal s(t) is multiplied by a signal cos (2π·f0·t) and in which the result of the multi- plication is sent to a low-pass filter 10 at the output of which the signal I(t) is retrieved,
- and a second circuit in which the signal s(t) is multiplied with a signal sin (2π·f0·t) and in which the result of this multiplication is sent to a low-pass filter 10 at the output of which the signal Q(t) is retrieved.

On the basis of the sampled signals I(t), Q(t), the central unit 2 applies a second transformation to the signals, making it possible to obtain second transformed signals K'1(t)=I(−t) and K'2(t)=−Q(−t).

These signals K'1(t), K'2(t) are sent in digital form by the central unit 2, in real time or in non-real time, to the modulator set 5, and said modulator set applies a third transformation, the inverse of the abovementioned first transformation, to these signals to obtain a signal s(−t) which, in real notation, may be written:

$$s(-t) = A(-t)\cos[2\pi \cdot f0 \cdot t - \phi(-t)]$$

In the example represented in FIG. 1, the modulator set 5 comprises a digital/analog converter 11 which receives the signals I(−t), −Q(−t) in sampled form from the central unit 2 and which recasts these signals into analog form, the converter 11 feeding two parallel circuits of an IQ modulator 12:
- a first circuit in which the signal K'1(t)=I(−t) is multiplied with a signal cos (2π·f0·t), the result of this multiplication optionally passing through a bandpass filter 13,
- and a second circuit in which the signal −Q(−t) is multiplied with a signal sin (2π·f0·t), the result of this multiplication optionally passing through a bandpass filter 13.

The outputs of the two bandpass filters 13 are added together to reconstitute the signal s(−t) which is sent, for example by way of an amplifier 14, to the transmitting antenna 6.

In the course of one or more of the first, second and third transformations, the signal may be multiplied by constant or nonconstant coefficients, so that the temporal inversion signal finally obtained may be written α·s(−t), α being a constant or nonconstant coefficient (in all cases in point, if α is a time-varying coefficient, it is preferably slowly varying with respect to s(t)).

It will be noted that in the procedure for processing the signals, the analog/digital conversions and the actual temporal inversion processing are performed on the demodulated signals, or baseband signals, hence at a frequency generally below f0, much smaller than the frequency of the signals s(t) or s(−t). It is therefore possible to use, to perform these operations, much simpler electronics than would be necessary to temporally invert the signal s(t) directly in order to obtain the temporal inversion signal s(−t).

By way of example, the central frequency f0 of the electromagnetic wave may be between 0.7 and 50 GHz, for example between 0.7 and 10 GHz. The passband Δf may be for example between 1 and 500 MHz, for example between 1 and 5 MHz.

Of course, these frequency values are not limiting, and the method according to the invention could be used to process all sorts of electromagnetic waves, including waves whose frequencies lie in the span of optical waves, in particular by replacing the antennas 3, 6 and the demodulator and modulator sets 4, 5 with equivalent elements operating by optics.

It will be noted moreover that the first second and third aforesaid transformations could be different from those mentioned explicitly hereinabove, provided that:
- the first transformation produces a first set of transformed signals, comprising at least one first transformed signal Ki(t) of lower central frequency than the initial signal s(t), said first set of transformed signals Ki(t) being representative of the initial signal s(t): stated otherwise, the first transformation lowers the central frequency of the signal, substantially without loss of information with respect to the initial signal s(t), the second transformation produces at least one second transformed signal K'i(t) substantially of the same central frequency as the first transformed signal, said second set of transformed signals K'i(t) being representative of the temporal inversion signal s(−t), and the third transformation generates the temporal inversion signal s(−t) from the second set of transformed signals, this third transformation being advantageously able to be the transformation inverse to the aforesaid first transformation.

As explained previously, the signal may be multiplied by coefficients that are constant or nonconstant in the course of one or more of these transformations, in which case the final signal is α·s(−t).

In the most common cases, the first transformation may be a transformation of demodulation type suitable for eliminating the carrier signal of frequency f0 and extracting therefrom modulation signals Ki(t) or baseband signals, the third transformation being the inverse modulation, obtained by modulating a carrier signal of frequency f0 by the signal or signals K'i(t).

These modulations and demodulations may be an IQ demodulation and an IQ modulation as mentioned explicitly hereinabove, but may, as appropriate, be a demodulation and a modulation in amplitude and phase. In this case, the demodulation, constituting the first aforesaid transformation, produces two first transformed signals K1(t)=A(t) and K2(t)=φ(t) corresponding respectively to the amplitude and to the phase of the signal s(t) The second transformation then generates, from the signals K1(t) and K2(t), second transformed signals K'1(t)=A(−t) and K'2(t)=−φ(−t), and the third transformation is a modulation inverse to said demodulation, producing the temporal inversion signal s(−t) by modulation of a carrier of frequency f0 in amplitude and phase with the second transformed signals K'1(t) and K'2(t):

$$s(-t)=A(-t)\cos[2\pi \cdot f0 \cdot t - \phi(-t)]$$

Moreover, the aforesaid first and third transformations may also be transformations different from a demodulation and from a modulation.

For example, the first transformation may be a subsampling of the signal s(t), with a sampling frequency of less than 2f0 but at least equal to 2Δf, producing a single sampled transformed signal K1(t). In this case, the second transformation may consist of a temporal inversion which generates a second transformed signal K'1(t)=K1(−t), and the third transformation may consist of a filtering of the signal K'1(t) after conversion to an analog signal, this filtering having a passband centered on the frequency f0 and of width Δf.

According to another variant, the first transformation may simply consist of a downward frequency shift, in intermediate band, producing a single first transformed signal K1(t) having a central frequency above Δf/2, in which case the second transformation is a temporal inversion transforming the signal K1(t) into K'1(t)=K1(−t), and the third transformation is an upward frequency shift, the inverse of said downward frequency shift applied initially to the signal s(t).

Additionally, it will be noted that the electromagnetic wave corresponding to the temporal inversion signal s(−t) is not necessarily retransmitted immediately after the wave s(t) has been received by the antenna 3. On the contrary, the signal s(−t), or the signal or signals K'i(t) representative of this temporal inversion signal s(−t), may be determined during a learning phase and remain in memory of the central unit 2 so as to be reused subsequently in order to transmit an electromagnetic wave having desired spatial and temporal focusing characteristics.

For example, if the central unit 2, the demodulator set 4 and the modulator set 5 are integrated into a radio telephone, and if similar elements are integrated into a fixed base belonging for example to a cellular radio telephone network, it is conceivable that, during said learning phase, the fixed base and/or the radio telephone may transmit a predetermined signal, for example a pulsed signal, and that the device (radio telephone or fixed base) which receives this signal may store the corresponding temporal inversion signal s(−t) or the second transformed signals K'i(t) representative of this temporal inversion signal.

In this case, when one of the two devices has to dispatch a message m(t) to the other of these devices, it can calculate a transmission signal S(t)=m(t)⊗s(−t) where ⊗ is the convolution operator, and transmit an electromagnetic wave corresponding to this signal S(t). In this case, especially if the ambient medium is highly reverberant in respect of electromagnetic waves, this generally being the case in particular for an urban medium, the electromagnetic wave transmitted is focused with great accuracy on the device which has to receive the message, and the signal picked up by this receiver device is directly the message m(t).

It is thus possible to obtain a bi-directional communication between the two apparatuses which is extremely discreet, since the electromagnetic waves, on account of their narrow focusing, are picked up effectively only by the two apparatuses. In a reverberant medium, the overall throughput of a radio telecommunications network integrating the whole set of these apparatuses is thus considerably increased, Of course, the learning step during which are determined the signals K'i(t) in the various apparatuses may be iteratively repeated at regular or irregular intervals, to take account of the modifications of the medium (weather conditions, movements of objects reflecting electromagnetic waves such as vehicles or the like, etc.) and/or movements of the mobile radio telephones integrated into the telecommunications network.

Moreover, it will also be noted that the transmitting antenna 6 and receiving antenna 3 may be merged into one and replaced by a single antenna, for example in telecommunications applications.

However, these antennas are not necessarily situated in the vicinity of one another. Moreover, the receiving antenna 3 may possibly be used only in the course of an initial learning step making it possible to determine the signals K'i(t), for example when one wishes to use the method according to the invention only for a unidirectional communication, or for applications other than telecommunication applications, in particular applications aimed at destroying or heating a medium in a very localized manner by focusing electromagnetic waves at the initial point where the receiving antenna 3 was located.

Figure 2:
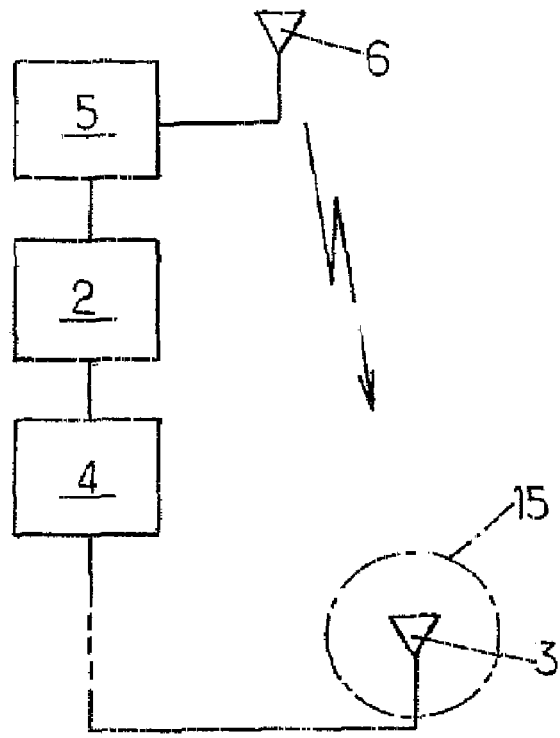
FIGS. 2 and 3 illustrate a particular application of the device of FIG. 1.
Figure 3:
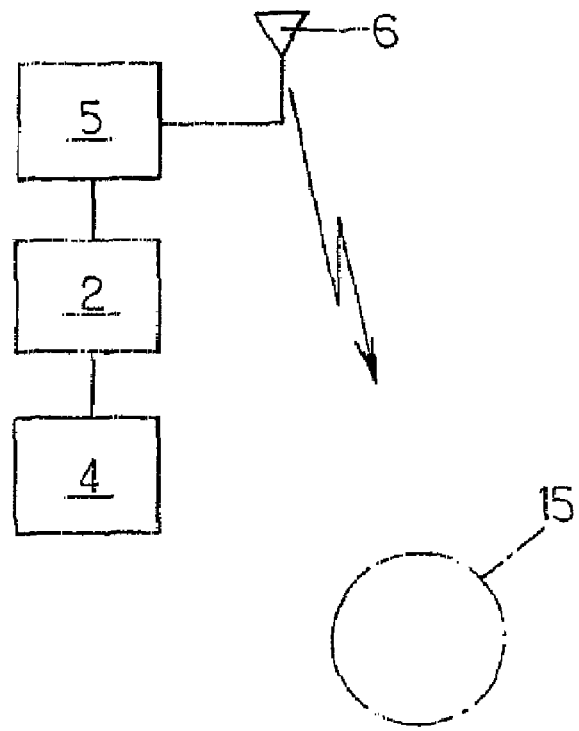

In this case, it is possible for example, in the course of the learning phase, to have the transmitting antenna 6 transmit a predetermined signal S(t), to pick up the corresponding electromagnetic wave s(t) by means of the receiving antenna 3, at a location 15 (FIG. 2) where one wishes to focus the electromagnetic waves, then to determine the signals K'i(t) by one of the processes indicated previously, thereby subsequently making it possible to generate, at the level of the antenna 6, a temporal inversion signal s(−t). When this signal s(−t) is subsequently transmitted at the level of the transmitting antenna 6, optionally after dismantling of the antenna 3 (FIG.

3), the predetermined signal (fox example a pulsed signal, or the like) initially transmitted by the transmitting antenna 6 in the course of the learning phase, is received in a very focused manner at the location 15 occupied initially by the receiving antenna 3.

To very accurately focus the waves onto the zone 15, it is also possible to initially transmit the desired signal S(t) from the zone 15, then to pick up the corresponding signal s(t) at the level of the antenna 3, merged into one with the antenna 6 or very close to this antenna 6. By subsequently re-transmitting the signal α·s(−t) by the antenna 6, it is possible to generate a wave S(t) very accurately focused on the zone 15, if appropriate after removing the antenna that initially transmitted the signal S(t).

To improve the quality of the focusing of the waves, it is possible to use the method according to the invention by transmitting and/or receiving the waves by way of a cavity reverberating the electromagnetic waves (or, when the waves are acoustic, by way of a "cavity" in the acoustic sense, consisting for example of a solid object that is reverberant in respect of acoustic waves, for example as described in French patent application no. 03 09140 filed on 25 Jul. 2003).

Moreover it will be noted that one and the same central unit 2 could be linked to a network of several antennas 3 and 6, each linked for example to a respectively demodulator or modulator set 4 or 5. For example, if the device 1 comprises a number J of receiving antennas 3 and a number L of transmitting antennas 6, the central unit 2 to calculate J*L sets of signals $K_{iji}(t)$ which make it possible to determine J*L temporal inversion signals $s_{jl}(-t)$, from J*L initial signals $s_{jl}(t)$ It will also be noted that, in the various embodiments of the invention, the signals K'i(t) and/or the signals s(−t) corresponding to one or more antennas may be used, if appropriate, iteratively, for example as indicated in document WO-A-03/101302, in such a way as to maximize the accuracy of the focusing of the electromagnetic waves Finally, the method according to the invention is applicable not only to electromagnetic waves, but also to acoustic or elastic waves, on simply replacing the antennas 3, 6 with acoustic transducers, so permitting communication applications based on acoustics (for example underwater communication) or else ultrasound imaging (echography or the like, microscopy, etc.).

The invention claimed is:

1. A method for temporal inversion of a wave corresponding to at least one initial signal s(t), where t is the time, this initial signal s(t) exhibiting a certain central frequency f0 and a passband Δf, in which method a temporal inversion signal α·s(−t), where α is a multiplicative coefficient and s(−t) is the temporal inversion of s(t), is determined, comprising:

providing a first transformation that is applied to the initial signal s(t) for lowering the central frequency of the initial signal and for substantially not causing any loss of information with respect to the initial signal, said first transformation producing a first set of transformed signals Ki(t) comprising at least one first transformed signal Ki(t) of lower central frequency than the initial signal, said first set of transformed signals Ki(t) being representative of said initial signal s(t), providing a second transformation that is applied to each first transformed signal Ki(t) to produce a second transformed signal K'i(t) substantially of the same central frequency as the first transformed signal Ki(t), said second transformation thus producing a second set of transformed signals K'i(t) from the first set of transformed signals Ki(t), said second transformation being chosen so that said second set of transformed signals K'i(t) is representative of the temporal inversion signal s(−t), and providing a third transformation that is applied to the second set of transformed signals K'i(t) which generates the temporal inversion signal α·s(−t), wherein said steps of providing a first transformation, providing a second transformation and providing a third transformation are implemented by a device for transmitting and receiving waves.

2. The method as claimed in claim 1, wherein the passband Δf is less than f0.

3. The method as claimed in claim 1, wherein the third transformation is a transformation inverse to the first transformation.

4. The method as claimed in claim 3, wherein the first transformation is a demodulation for eliminating a carrier signal of frequency f0 so as to extract said first set of transformed signals Ki(t) from the initial signal s(t), and the third transformation is a modulation of a carrier signal of frequency f0 by the signal or signals K'i(t).

5. The method as claimed in claim 4, wherein the first transformation is an IQ demodulation producing two first transformed signals K1(t)=I(t) and K2(t)=Q(t) such that s(t)=I(t)cos(2π·f0·t)+Q(t)sin(2π·f0·t), the second transformation transforms the signal K1(t) into K'1(t)=I(−t) and the signal K2(t) into K'2(t)=−Q(−t), and the third transformation is an IQ modulation inverse to said demodulation.

6. The method as claimed in claim 4, wherein the first transformation is an amplitude and phase demodulation producing two first transformed signals K1(t)=A(t), and K2(t)=φ(t), where A(t) is the amplitude of the signal s(t) and φ(t) the phase of the signal s(t), the second transformation transforms the signal K1(t) to K'1(t)=A(−t) and the signal K2(t) to K'2(t)=−φ(−t), and the third transformation is a modulation inverse to said demodulation, producing the temporal inversion signal s(−t)=A(−t)cos [2π·f0·t−φ(−t)].

7. The method as claimed in claim 1, wherein the first transformation is a subsampling, with a sampling frequency of less than 2f0 but at least equal to 2Δf, producing a single transformed signal K1(t), the second transformation is a temporal inversion transforming the signal K1(t) to K'1(t)=K1(−t), and the third transformation is a filtering of passband substantially equal to Δf and centered on f0, transforming K'1(t) into s(−t).

8. The method as claimed in claim 1, wherein the first transformation is a downward frequency shift, into intermediate band, producing a single first transformed signal K1(t), the second transformation is a temporal inversion transforming the signal K1(t) into K'1(t)=K1(−t), and the third transformation is an upward frequency shift, the inverse of said downward frequency shift.

9. The method as claimed in claim 1, wherein the first and third transformations are carried out on analog signals, each first transformed signal undergoes a sampling and the second transformation is carried out digitally before converting each second transformed signal into an analog signal.

10. The method as claimed in claim 9, wherein the sampling is carried out at a sampling frequency of below f0.

11. The method as claimed in claim 1, wherein the wave is electromagnetic.

12. The method as claimed in claim 11, wherein the central frequency f0 is between 0.7 and 50 GHz.

13. The method as claimed in claim 12, wherein the central frequency f0 is between 0.7 and 10 GHz.

14. The method as claimed in claim 1, wherein the wave is chosen from among acoustic waves and elastic waves.

\* \* \* \* \*